US012677667B2

(12) United States Patent
Kao et al.

(10) Patent No.: US 12,677,667 B2
(45) Date of Patent: Jul. 7, 2026

(54) ELECTRONIC DEVICE

(71) Applicant: InnoLux Corporation, Miao-Li County (TW)

(72) Inventors: Ker-Yih Kao, Miao-Li County (TW); Cheng-Chi Wang, Miao-Li County (TW); Yen-Fu Liu, Miao-Li County (TW); Ju-Li Wang, Miao-Li County (TW); Jui-Jen Yueh, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 374 days.

(21) Appl. No.: 18/231,245

(22) Filed: Aug. 7, 2023

(65) Prior Publication Data

US 2024/0079348 A1     Mar. 7, 2024

Related U.S. Application Data

(60) Provisional application No. 63/404,186, filed on Sep. 7, 2022.

(30) Foreign Application Priority Data

Jun. 13, 2023     (CN) .......................... 202310694426.0

(51) Int. Cl.
| | |
|---|---|
| *H10W 42/00* | (2026.01) |
| *H10D 30/67* | (2025.01) |
| *H10W 70/685* | (2026.01) |
| *H10W 74/10* | (2026.01) |
| *H10W 90/00* | (2026.01) |

(52) U.S. Cl.
CPC ...... *H10W 42/121* (2026.01); *H10D 30/6758* (2025.01); *H10W 70/685* (2026.01); *H10W 74/117* (2026.01); *H10W 90/794* (2026.01)

(58) Field of Classification Search
CPC ............ H10W 42/121; H10W 70/685; H10W 74/117; H10W 90/794; H10W 72/20; H10D 30/6758
See application file for complete search history.

(56) References Cited

U.S. PATENT DOCUMENTS

| | | | |
|---|---|---|---|
| 2012/0048607 A1* | 3/2012 | Takahashi | ............. H01L 21/563 174/260 |
| 2019/0348346 A1* | 11/2019 | Gurrum | ............ H01L 23/49503 |
| 2020/0321301 A1* | 10/2020 | Mitarai | ............... H01L 23/3107 |

(Continued)

FOREIGN PATENT DOCUMENTS

| | | |
|---|---|---|
| CN | 113948488 A | 1/2022 |
| TW | 202114084 A | 4/2021 |

(Continued)

*Primary Examiner* — Dao H Nguyen
(74) *Attorney, Agent, or Firm* — Winston Hsu

(57) ABSTRACT

An electronic device includes a chip and a circuit structure layer overlapped with the chip. The circuit structure layer includes a redistribution structure layer and an element structure layer, and the redistribution structure layer and the element structure layer are electrically connected to the chip. At least one of the redistribution structure layer and the element structure layer includes at least one opening, and in a normal direction of the electronic device, the at least one opening is overlapped with aside of the chip.

17 Claims, 9 Drawing Sheets

(56)     References Cited

U.S. PATENT DOCUMENTS

| 2021/0305108 A1* | 9/2021 | Sankman | H01L 21/4857 |
| 2022/0115333 A1* | 4/2022 | Han | H01L 23/49838 |
| 2022/0208996 A1 | 6/2022 | Batra | |
| 2023/0066598 A1* | 3/2023 | Lai | H01L 23/3135 |
| 2023/0386951 A1* | 11/2023 | Lin | H01L 23/5383 |
| 2024/0055468 A1* | 2/2024 | Chen | H01L 21/6835 |
| 2024/0063131 A1* | 2/2024 | Lee | H01L 24/20 |
| 2024/0145433 A1* | 5/2024 | Lin | H01L 24/73 |

FOREIGN PATENT DOCUMENTS

| TW | 202209625 A | 3/2022 |
| TW | 202213778 A | 4/2022 |

* cited by examiner

ELECTRONIC DEVICE

CROSS REFERENCE TO RELATED APPLICATION

This application claims the benefit of U.S. Provisional Application No. 63/404,186, filed on Sep. 7, 2022. The content of the application is incorporated herein by reference.

BACKGROUND OF THE DISCLOSURE

1. Field of the Disclosure

The present disclosure relates to an electronic device, and more particularly to an electronic device including a package structure.

2. Description of the Prior Art

The electronic device may include a chip and a redistribution layer for electrically connecting the chip to other electronic elements. However, the layers in the redistribution layer may be easily damaged due to being affected by stress. Therefore, to reduce the stress in the package structure is still an important issue in the present field.

SUMMARY OF THE DISCLOSURE

In some embodiments, an electronic device is provided by the present disclosure. The electronic device includes a chip and a circuit structure layer overlapped with the chip. The circuit structure layer includes a redistribution structure layer and an element structure layer, and the redistribution structure layer and the element structure layer are electrically connected to the chip. At least one of the redistribution structure layer and the element structure layer includes at least one opening, and in a normal direction of the electronic device, the opening is overlapped with a side of the chip.

These and other objectives of the present disclosure will no doubt become obvious to those of ordinary skill in the art after reading the following detailed description of the embodiment that is illustrated in the various figures and drawings.

DETAILED DESCRIPTION

Figure 1:
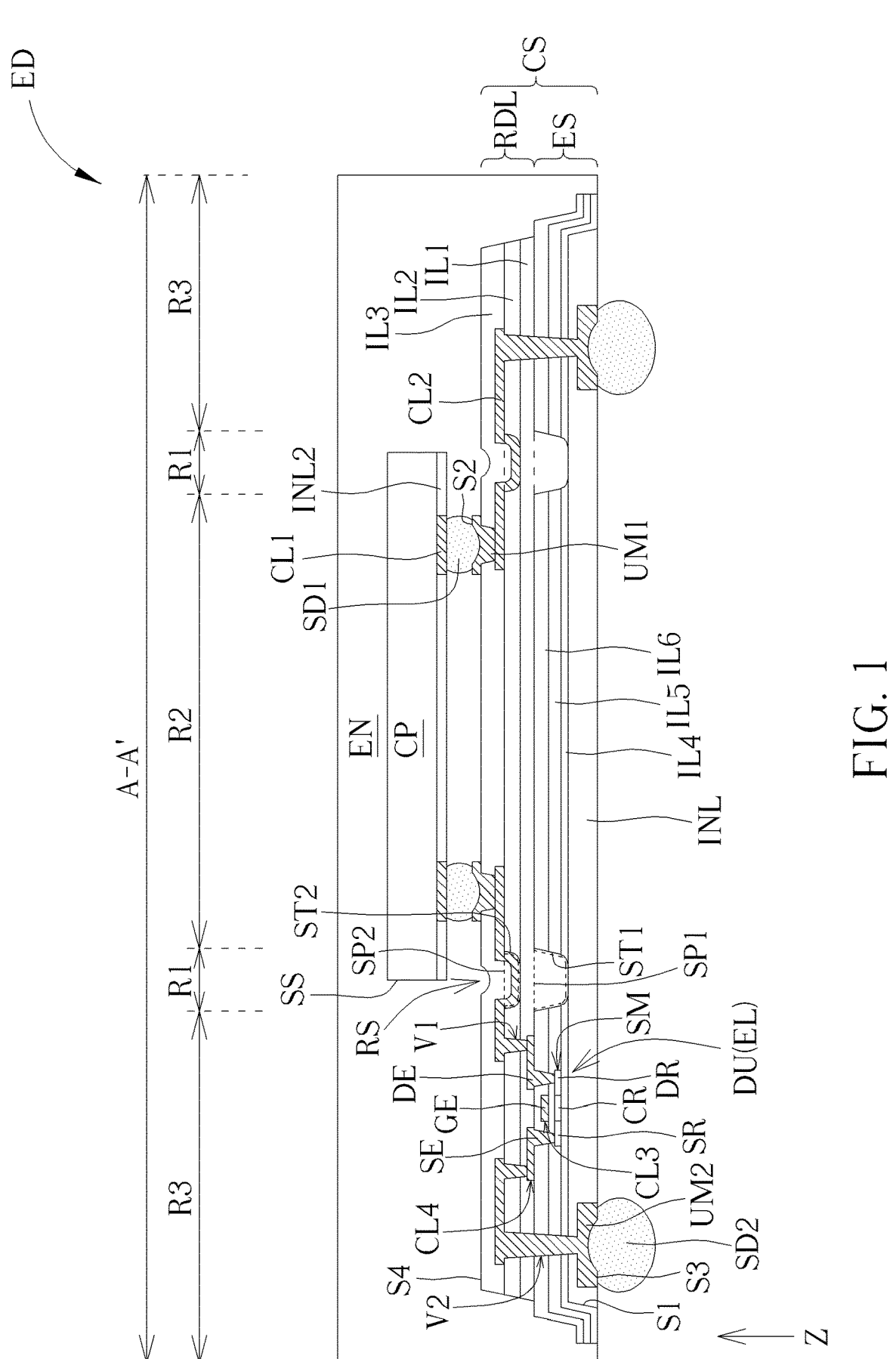
FIG. 1 schematically illustrates a cross-sectional view of an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function.

In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented. When an element or a layer is referred to as being "electrically connected" to another element or layer, it can be a direct electrical connection or an indirect electrical connection. The electrical connection or coupling described in the present disclosure may refer to a direct connection or an indirect connection. In the case of a direct connection, the ends of the elements on two circuits are directly connected or connected to each other by a conductor segment. In the case of an indirect connection, switches, diodes, capacitors, inductors, resistors, other suitable elements or combinations of the above elements may be included between the ends of the elements on two circuits, but not limited thereto.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

According to the present disclosure, the thickness, length and width may be measured through optical microscope, and the thickness or width may be measured through the cross-sectional view in the electron microscope, but not limited thereto.

In addition, any two values or directions used for comparison may have certain errors. In addition, the terms "equal to", "equal", "the same", "approximately" or "substantially" are generally interpreted as being within ±20%, ±10%, ±5%, ±3%, ±2%, ±1%, or ±0.5% of the given value.

In addition, the terms "the given range is from a first value to a second value" or "the given range is located between a first value and a second value" represents that the given range includes the first value, the second value and other values there between.

If a first direction is said to be perpendicular to a second direction, the included angle between the first direction and the second direction may be located between 80 to 100 degrees. If a first direction is said to be parallel to a second direction, the included angle between the first direction and the second direction may be located between 0 to 10 degrees.

Unless it is additionally defined, all terms (including technical and scientific terms) used herein have the same meaning as commonly understood by those ordinary skilled in the art. It can be understood that these terms that are defined in commonly used dictionaries should be interpreted as having meanings consistent with the relevant art and the background or content of the present disclosure, and should not be interpreted in an idealized or overly formal manner, unless it is specifically defined in the embodiments of the present disclosure.

It should be noted that the technical features in different embodiments described in the following can be replaced, recombined, or mixed with one another to constitute another embodiment without departing from the spirit of the present disclosure.

The electronic device of the present disclosure may include a semiconductor device, a package device, a display device, a sensing device, a back-light device, an antenna device, a tiled device or other suitable electronic devices, but not limited thereto. The electronic device of the present disclosure may include any suitable device applied to the above-mentioned devices. The electronic device may be a foldable electronic device, a flexible electronic device or a stretchable electronic device. The display device may for example be applied to laptops, common displays, tiled displays, vehicle displays, touch displays, televisions, monitors, smart phones, tablets, light source modules, lighting devices or electronic devices applied to the products mentioned above, but not limited thereto. The sensing device may include a biosensor, a touch sensor, a fingerprint sensor, other suitable sensors or combinations of the above-mentioned sensors. The antenna device may for example include a liquid crystal antenna device or a non-liquid crystal antenna device, but not limited thereto. The tiled device may for example include a tiled display device or a tiled antenna device, but not limited thereto. The outline of the electronic device may be a rectangle, a circle, a polygon, a shape with curved edge or other suitable shapes. The electronic device may include electronic units, wherein the electronic units may include passive elements or active elements, such as capacitor, resistor, inductor, diode, transistor, sensors, and the like. The diode may include a light emitting diode or a photo diode. The light emitting diode may for example include an organic light emitting diode (OLED) or an in-organic light emitting diode. The in-organic light emitting diode may for example include a mini light emitting diode (mini LED), a micro light emitting diode (micro LED) or a quantum dot light emitting diode (QLED), but not limited thereto. It should be noted that the electronic device of the present disclosure may be combinations of the above-mentioned devices, but not limited thereto. It should be noted that the electronic device may be arrangements of the above-mentioned devices, but the present disclosure is not limited thereto. The electronic device may include peripheral systems such as driving systems, controlling systems, light source systems to support display devices, antenna devices, wearable devices (such as augmented reality devices or virtual reality devices), vehicle devices (such as windshield of car) or tiled devices.

Referring to FIG. 1, FIG. 1 schematically illustrates a cross-sectional view of an electronic device according to a first embodiment of the present disclosure. Specifically, FIG. 1 shows the cross-sectional structure of the structure shown in FIG. 2 along a sectional line A-A'. According to the present embodiment, as shown in FIG. 1, the electronic device ED may include a chip CP and a circuit structure layer CS, wherein in a normal direction of the electronic device ED (that is, parallel to the direction Z, which will not be redundantly described in the following), the circuit structure layer CS may be overlapped with the chip CP. The circuit structure layer CS may include a redistribution structure layer RDL and an element structure layer ES, wherein the element structure layer ES may be located at a side of the redistribution structure layer RDL opposite to the chip CP, that is, the redistribution structure layer RDL may be located between the chip CP and the element structure layer ES, but not limited thereto. The electronic device ED may further include a buffer layer INL disposed at a side of the element structure layer ES opposite to the redistribution structure layer RDL, that is, the element structure layer ES may be disposed between the buffer layer INL and the redistribution structure layer RDL. The electronic device ED may further include an encapsulation layer EN, wherein the encapsulation layer EN may surround the chip CP. "The encapsulation layer EN surrounds the chip CP" mentioned above may represent that at least a portion of the chip CP is disposed in the encapsulation layer EN, and the encapsulation layer EN may contact the side surface of the chip CP in the cross-sectional view of the electronic device ED (for example, FIG. 1). The encapsulation layer EN may be used to encapsulate the chip CP, the circuit structure layer CS or other elements and/or layers of the electronic device ED. The encapsulation layer EN may include any suitable encapsulation material. For example, the encapsulation layer EN may include organic materials, inorganic materials or combinations of the above-mentioned materials. The encapsulation layer EN may include transparent encapsulation materials or opaque encapsulation materials. It should be noted that although FIG. 1 shows the structure that the encapsulation layer EN encapsulates a single chip CP, the present disclosure is not limited thereto. In some embodiments, the encapsulation layer EN may be used to encapsulate multiple chips CP, that is, the electronic device ED may include a multi-chip encapsulation structure. The encapsulation layer EN may reduce the influence of external moisture on the elements and/or the layers of the electronic device ED. In the present embodiment, the forming method of the electronic device ED may include forming the circuit structure layer CS at first, and then forming the chip CP. That is, the forming method of the electronic device ED may include a redistribution layer-first (RDL-first) process. Specifically, the circuit structure layer CS may be formed on the buffer layer INL at first, and then the chip CP may be disposed on the circuit structure layer CS. After that, the encapsulation layer EN may be disposed to cover the chip CP and the circuit structure layer CS to form the electronic device ED.

It should be noted that the forming method of the electronic device ED of the present disclosure is not limited to the above-mentioned method.

The structures of the elements of the electronic device ED of the present embodiment will be detailed in the following.

The chip CP of the present disclosure may include an integrated circuit (IC) chip, a diode chip, other suitable chips or combinations of the above-mentioned chips, according to the type or application of the electronic device ED. For example, when the electronic device ED includes a display device, the chip CP may include alight emitting diode chip, but not limited thereto. The chip CP may be electrically connected to the circuit structure layer CS. Specifically, the redistribution structure layer RDL and the element structure layer ES of the circuit structure layer CS may be electrically connected to the chip CP. For example, as shown in FIG. 1, the chip CP may include an insulating layer INL2 disposed at a side of the chip CP facing the circuit structure layer CS, a conductive layer CL1 may be disposed in the insulating layer INL2, and the chip CP may be electrically connected to a under bump metallization layer UM1 through the conductive layer CL1 and a bonding pad SD1. The under bump metallization layer UM1 may be disposed in one of the insulating layers of the redistribution structure layer RDL closest to the chip CP (for example, the insulating layer IL3), but not limited thereto. The under bump metallization layer UM1 may be electrically connected to the redistribution structure layer RDL and the element structure layer ES of the circuit structure layer CS, such that the chip CP may be electrically connected to the redistribution structure layer RDL and the element structure layer ES. The under bump metallization layer UM1 and the conductive layer CL1 may include any suitable conductive material, such as molybdenum (Mo), tantalum (Ta), niobium (Nb), hafnium (Hf), nickel (Ni), chromium (Cr), cobalt (Co), zirconium (Zr), tungsten (W), aluminum (Al), titanium (Ti), copper (Cu), other suitable metals, alloys of the metals mentioned above, or combinations of the above-mentioned materials. In some embodiments, the under bump metallization layer UM1 and the conductive layer CL1 may for example be a single metal layer or a stacked structure formed by stacking a plurality of sub metal layers, but not limited thereto. The bonding pad SD1 may include tin (Sn), nickel, gold (Au), silver (Ag), tin-included alloy or other suitable conductive materials. It should be noted that the structures of the insulating layer INL2 and the conductive layer CL1 shown in FIG. 1 are exemplary. In some embodiments, the insulating layer INL2 may include a structure formed by stacking a plurality of insulating layers. The insulating layer INL2 may include organic materials or inorganic materials. The thickness of the insulating layer INL2 may be greater than or equal to 0.5 micrometer (μm) and less than or equal to 20 μm. The chip CP may be formed by cutting a wafer or a semiconductor substrate, and when the wafer or the semiconductor substrate includes fragile materials, cracking or chipping may occur after the cutting process. According to the present embodiment, cracking or chipping of the wafer or the semiconductor substrate may be reduced through the thickness design of the insulating layer INL2. For example, the thickness of the insulating layer INL2 may be designed to be greater than or equal to 7 μm and less than or equal to 20 μm, more preferably to be greater than or equal to 10 μm and less than or equal to 20 μm, but not limited thereto.

The redistribution structure layer RDL may include any suitable layer capable of adjusting the positions of signal input terminal and signal output terminal or adjusting the layout of wires. In the present disclosure, the redistribution structure layer RDL may include a stacked structure formed by stacking at least one insulating layer and at least one conductive layer, wherein the stacking direction of the insulating layer and the conductive layer may for example be parallel to the normal direction of the electronic device ED. For example, as shown in FIG. 1, the redistribution structure layer RDL of the present embodiment may include an insulating layer IL1, an insulating layer IL2 disposed on the insulating layer IL1, a conductive layer CL2 disposed on the insulating layer IL2, and an insulating layer IL3 disposed on the insulating layer IL2 and covering the conductive layer CL2, but not limited thereto. The insulating layer IL1, the insulating layer IL2 and the insulating layer IL3 may include any suitable organic material, such as photosensitive polyimide (PSPI), Ajinomoto build-up film, combinations of the above-mentioned materials or other build up materials, but not limited thereto. The conductive layer CL2 may include any suitable conductive material, and the material of the conductive layer CL2 may be the same as or different from the material of the conductive layer CL1. It should be noted that the numbers or disposition positions of the insulating layers and the conductive layers in the redistribution structure layer RDL shown in FIG. 1 are exemplary, and the present disclosure is not limited thereto.

The element structure layer ES may include an electronic element EL for receiving signals from the chip CP or transmitting signals to the chip CP, but not limited thereto. The electronic element EL may for example include at least one switch element, at least one driving element, at least one protection element or other suitable active elements or passive elements, according to the design of the electronic device ED. Specifically, the electronic element EL and the layers for disposing the electronic element EL in the electronic device ED may be regarded as a portion of the element structure layer ES. In the present embodiment, the electronic element EL may include a driving element DU, but not limited thereto. The driving element DU may include a thin film transistor. Therefore, the element structure layer ES may include the thin film transistor and the layers for disposing the thin film transistor. Specifically, as shown in FIG. 1, the element structure layer ES may include an insulating layer IL4, a semiconductor layer SM disposed on the insulating layer IL4, an insulating layer IL5 disposed on the insulating layer IL4 and covering the semiconductor layer SM, a conductive layer CL3 disposed on the insulating layer IL5, an insulating layer IL6 disposed on the insulating layer IL5 and covering the conductive layer CL3, and a conductive layer CL4 disposed on the insulating layer IL6, but not limited thereto. The insulating layer IL4, the insulating layer IL5 and the insulating layer IL6 may include any suitable insulating material, such as organic insulating materials or inorganic insulating materials, but not limited thereto. The organic insulating materials may for example include photosensitive polyimide or Ajinomoto build-up film, and the inorganic insulating materials may for example include silicon oxide, silicon nitride or silicon oxynitride, but not limited thereto. The semiconductor layer SM may form the channel region CR, the source region SR and the drain region DR of the driving element DU. The material of the semiconductor layer SM may for example include low temperature polysilicon (LTPS), low temperature polysilicon oxide (LTPO) or amorphous silicon (a-Si), but not limited thereto. The conductive layer CL3 may form the gate electrode GE of the driving element DU. In the normal direction of the electronic device ED, the channel region CR may be defined as the portion of the semiconductor layer SM overlapped with the gate electrode GE. The conductive layer CL4 may form the source electrode SE and the drain electrode DE respectively be electrically connected to the source region SR and the drain region DR. The source electrode SE and the drain electrode DE may be filled into the vias penetrating the insulating layer IL5 and the insulating layer IL6 to be respectively electrically connected to the source region SR and the drain region DR. It should be noted that in some embodiments, the source region SR and the source electrode SE may respectively be the drain region and the drain electrode while the drain region DR and the drain electrode DE may respectively be the source region and the source electrode. That is, the positions or functions of the source region SR/source electrode SE and the drain region DR/drain electrode DE may exchange. The conductive layer CL3 and the conductive layer CL4 may include any suitable conductive material, such as metals, but not limited thereto. Although it is not shown in FIG. 1, the element structure layer ES may further include other suitable electronic elements EL in addition to the driving element DU. It should be noted that the structure of the element structure layer ES of the present disclosure is not limited to what is shown in FIG. 1. In addition, although the electronic element EL of the present embodiment includes a top gate thin film transistor, the present disclosure is not limited thereto. In some embodiments, the electronic elements EL may include a bottom gate thin film transistor, a dual gate thin film transistor or other types of thin film transistor.

According to some embodiments, in the normal direction of the electronic device ED, the thickness of the insulating layers of the element structure layer ES may be lower than the thickness of the insulating layers of the redistribution structure layer RDL. Therefore, the influence of the noise generated by the electronic elements in the element structure layer ES on the electrical quality may be reduced, but not limited thereto. For example, the thickness of the insulating layers (such as the insulating layer IL4, the insulating layer IL5 and the insulating layer IL6) of the element structure layer ES may be greater than or equal to 0.1 μm and less than or equal to 5 μm, and the thickness of the insulating layers (such as the insulating layer IL1, the insulating layer IL2 and the insulating layer IL3) of the redistribution structure layer RDL may be greater than or equal to 6 μm and less than or equal to 15 μm. According to some embodiments, the thermal expansion coefficient of the insulating layers of the element structure layer ES may be lower than the thermal expansion coefficient of the insulating layers of the redistribution structure layer RDL. For example, the thermal expansion coefficient of the insulating layers of the element structure layer ES may be greater than or equal to 0.1 ppm/° C. and less than or equal to 10 ppm/° C., and the thermal expansion coefficient of the insulating layers of the redistribution structure layer RDL may be greater than or equal to 12 ppm/° C. and less than or equal to 30 ppm/° C. In some embodiments, the warping tendency of the insulating layers of the element structure layer ES may be opposite to the warping tendency of the insulating layers of the redistribution structure layer RDL. Therefore, the stress in the electronic device ED may be reduced, such that the risk of cracking of the electronic device ED may be reduced, thereby improving the reliability of the electronic device ED.

According to the present disclosure, the buffer layer INL may be used to block the metal ions (for example, the metal ions from the outside) and prevent the metal ions from diffusing to the electronic element EL in the element structure layer ES. Therefore, the probability that the electronic element EL is damaged due to being affected by the metal ions may be reduced. The buffer layer INL may further provide a flat surface to facilitate the disposition of the circuit structure layer CS on the buffer layer INL. Specifically, the buffer layer INL may serve as a planarization layer to facilitate the deposition process on the surface of the buffer layer INL to from the electronic element EL, such as the driving element DU. Although the buffer layer INL shown in FIG. 1 is a single-layer structure, the present disclosure is not limited thereto. In some embodiments, the buffer layer INL may include a multi-layer structure. In addition, in some embodiments, the buffer layer INL may include a structure formed by stacking insulating layers and conductive layers and may thereby serve as another redistribution layer.

Figure 3:
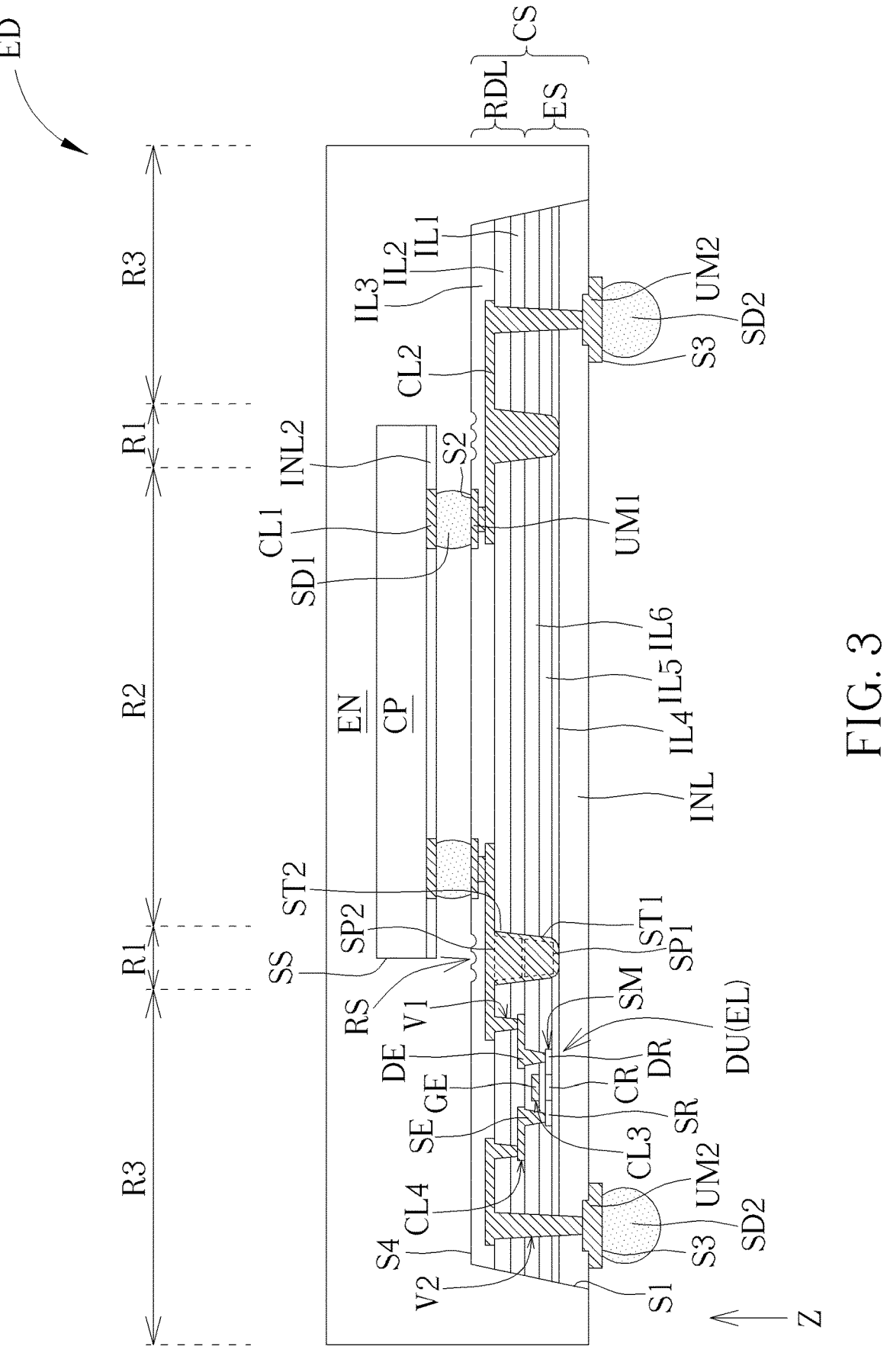
FIG. 3 schematically illustrates a cross-sectional view of an electronic device according to a second embodiment of the present disclosure.

According to the present disclosure, the insulating layers of the element structure layer ES disposed on the buffer layer INL may protrude from the buffer layer INL or be aligned with the side surface S1 of the buffer layer INL, based on the manufacturing process (such as the cutting process) of the electronic device ED. For example, in the present embodiment, as shown in FIG. 1, the insulating layers IL4, the insulating layer IL5 and the insulating layer IL6 of the element structure layer ES may protrude from the side surface S1 of the buffer layer INL and extend on the side surface S1 to the bottom of the side surface S1, but not limited thereto. In some embodiments, the insulating layer IL4, the insulating layer IL5 and the insulating layer IL6 may be aligned with the side surface S1 of the buffer layer INL, or the side surfaces of the insulating layer IL4, the insulating layer IL5 and the insulating layer IL6 may be coplanar with the side surface S1 of the buffer layer INL but not cover the side surface S1, which is shown in FIG. 3.

According to the present embodiment, the chip CP may be electrically connected to the redistribution structure layer RDL (for example, electrically connected to the conductive layer CL2 of the redistribution structure layer RDL), thereby being electrically connected to the electronic element EL in the element structure layer ES through the redistribution structure layer RDL. For example, as shown in FIG. 1, a portion of the conductive layer CL2 of the redistribution structure layer RDL may be electrically connected to the chip CP, and the portion of the conductive layer CL2 may be filled into the via V1 penetrating the insulating layer IL1 and the insulating layer IL2 and contact one of the source electrode SE and the drain electrode DE (for example, the drain electrode DE shown in FIG. 1, but not limited thereto) of the driving element DU of the element structure layer ES, such that the chip CP may be electrically connected to the electronic element EL. Therefore, the operation of the chip CP may be controlled by the driving element DU, or the signals may be transmitted from the chip CP to the electronic element EL. In addition, another portion of the conductive layer CL2 may be electrically connected to another one of the drain electrode DE and the source electrode SE (for example, the source electrode SE shown in FIG. 1, but not limited thereto) of the driving element DU and a under bump metallization layer UM2, thereby being electrically connected to external electronic elements (not shown) through the under bump metallization layer UM2 and a bonding pad SD2. The external electronic elements may for example include printed circuit board (PCB), but not limited thereto. Specifically, a portion of the conductive layer CL2 may be filled into a via V2 penetrating the insulating layer IL1, the insulating layer IL2, the insulating layer IL4, the insulating layer IL5, the insulating layer IL6 and the buffer layer INL and contact the under bump metallization layer UM2. The under bump metallization layer UM2 may be disposed in the buffer layer INL, but not limited thereto. Therefore, the chip CP may be electrically connected to the external electronic elements through the circuit structure layer CS. As shown in FIG. 1, through the disposition of the redistribution structure layer RDL, the position of the signal input terminal (for example, the position corresponding to the conductive layer CL1) and the position of the signal output terminal (for example, the position corresponding to the under bump metallization layer UM2) respectively located at two sides of the redistribution structure layer RDL may not correspond to each other. In other words, the signal input/output terminal of the chip CP and the signal input/output terminal of the electronic device ED may be misaligned in the top view direction of the electronic device ED or may not be overlapped with each other in the normal direction. It should be noted that the ways of electrical connection of the chip CP, the circuit structure layer CS and the external electronic element mentioned above are exemplary, and the present embodiment is not limited thereto. In addition, in some embodiments, the circuit structure layer CS may include the redistribution structure layer RDL but not include the element structure layer ES, and the chip CP may be electrically connected to the external electronic elements through the redistribution structure layer RDL.

The under bump metallization layer in the electronic device ED of the present disclosure may have any suitable structure. In some embodiments, the under bump metallization layer may protrude from the surface of the insulating layer in which the under bump metallization layer is disposed, and the surface of the under bump metallization layer may have a concave structure. For example, as shown in FIG. 1, the surface of the under bump metallization layer UM1 in contact with the bonding pad SD1 (that is, the surface S2) may protrude from the surface of the insulating layer IL3, and the surface S2 of the under bump metallization layer UM1 may have a concave structure, or the under bump metallization layer UM1 may have a depressed surface S2. In some embodiments, the under bump metallization layer may be aligned with the surface of the insulating layer in which the under bump metallization layer is disposed, and the surface of the under bump metallization layer may have a concave structure. For example, as shown in FIG. 1, the surface of the under bump metallization layer UM2 in contact with the bonding pad SD2 (that is, the surface S3) may be aligned with the surface of the buffer layer INL or not protrude from the surface of the buffer layer INL, and the surface S3 of the under bump metallization layer UM2 may have a concave structure. By making the surface of the under bump metallization layer in contact with the bonding pad including the concave structure, the electrical connection between the under bump metallization layer and the bonding pad may be improved, thereby improving the reliability of the electronic device ED. The under bump metallization layer of the present disclosure may further include other suitable structures and is not limited to the above-mentioned structures.

Figure 2:
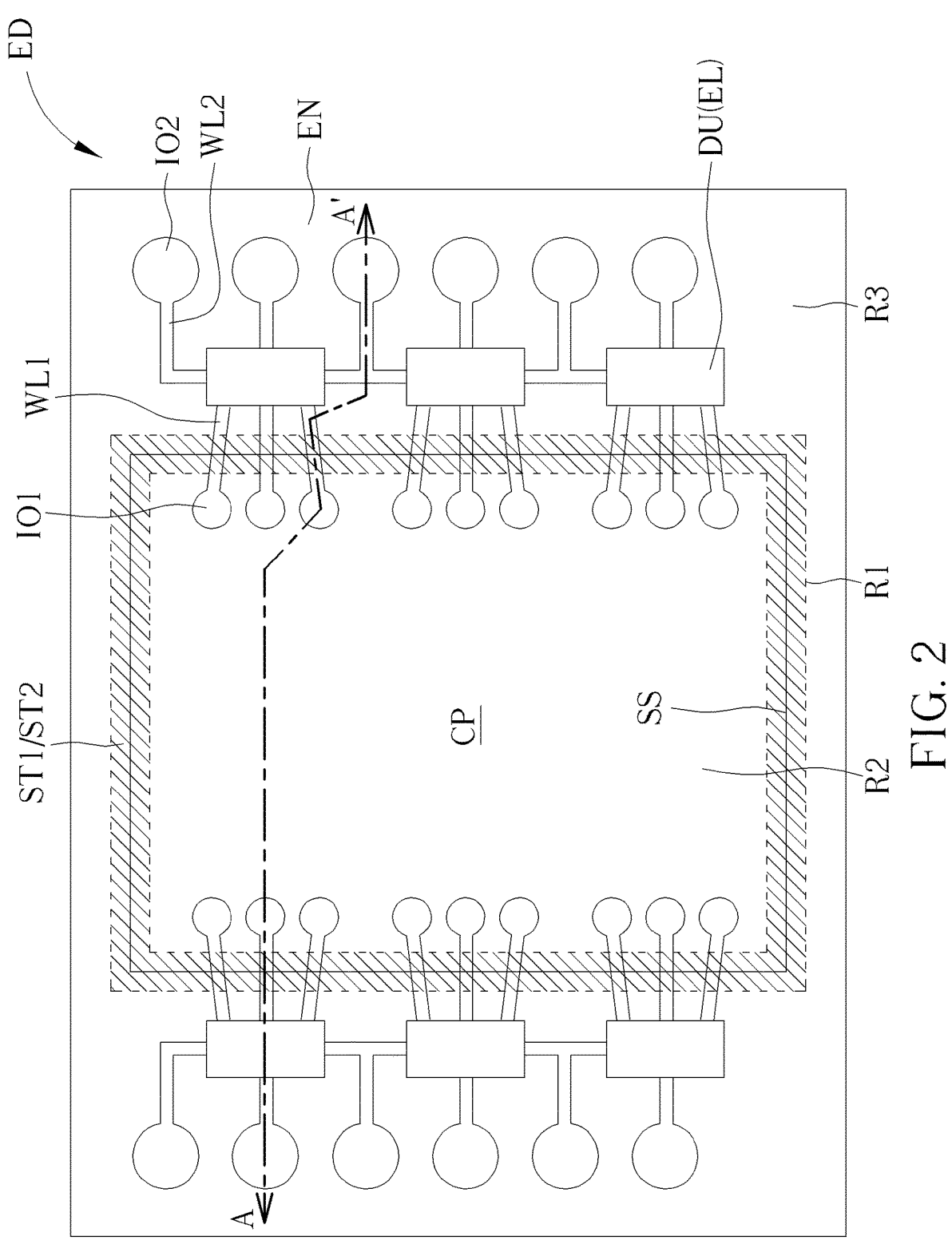
FIG. 2 schematically illustrates a top view of configuration of elements in the electronic device according to the first embodiment of the present disclosure.

Referring to FIG. 1 and FIG. 2, FIG. 2 schematically illustrates a top view of configuration of elements in the electronic device according to the first embodiment of the present disclosure, wherein FIG. 2 shows the main elements of the electronic device but not all the elements of the electronic device. Specifically, as shown in FIG. 2, the input/output points IO1 (hereinafter referred to as I/O point) of the chip CP may be electrically connected to the electronic element EL of the element structure layer ES through the wires WL1, and the electronic element EL may be electrically connected to the I/O points IO2 through the wires WL2. The I/O points IO1 may correspond to the position of the conductive layer CL1. The wires WL1 may include any suitable conductive element for electrically connecting the chip CP to the electronic element EL. For example, the wires WL1 may include the conductive layer(s) (for example, the conductive layer CL2) of the redistribution structure layer RDL. The wires WL2 may include any suitable conductive element for electrically connecting the electronic element EL to the under bump metallization layer UM2. For example, the wires WL2 may include a portion of the conductive layer CL2 shown in the left side of FIG. 1. The I/O points IO2 may correspond to the position of the under bump metallization layer UM2 and may be electrically connected to the external electronic element. It should be noted that FIG. 2 just exemplary shows the electrical connections between the elements, and the detailed structures or disposition positions of the elements are not shown. In addition, the numbers of the electronic element EL and the I/O points shown in FIG. 2 are exemplary.

According to the present embodiment, at least one of the redistribution structure layer RDL and the element structure layer ES may include at least one opening, wherein in the normal direction of the electronic device ED, the at least one opening may be overlapped with the side of the chip CP. Specifically, the opening may be overlapped with at least a portion of the side of the chip CP. The "opening" described herein may be the structure that disconnects at least one layer in the layer structure. In other words, when a layer structure includes an opening, in the cross-sectional view of the layer structure, at least one layer of the layer structure may be disconnected through the opening, or the portions of the at least one layer respectively at two sides of the opening are not connected to each other through the material of the at least one layer. Therefore, the "opening" mentioned above may be regarded as a through hole penetrating through the at least one layer. As shown in FIG. 1, the element structure layer ES of the present embodiment may include at least one first opening ST1, wherein the first opening ST1 may overlap the side SS of the chip CP in the normal direction of the electronic device ED. In the present embodiment, the first opening ST1 may be formed by removing portions of the insulating layer IL4, the insulating layer IL5 and the insulating layer IL6, but the present disclosure is not limited thereto. In other words, the first opening ST1 may serve as the through hole penetrating through the insulating layer IL4, the insulating layer IL5 and the insulating layer IL6. In such condition, the first opening ST1 may disconnect the insulating layer IL4, the insulating layer IL5 and the insulating layer IL6. In some embodiments, the first opening ST1 may be formed by removing a portion of the insulating layer IL4 and expose the top surface of the insulating layer IL5. In such condition, the first opening ST1 may disconnect the insulating layer IL4. In some embodiments, the first opening ST1 may be formed by removing portions of the insulating layer IL4 and the insulting layer IL5 and expose the top surface of the insulating layer IL6. In such condition, the first opening ST1 may disconnect the insulating layer IL4 and the insulating layer IL5. In addition, the redistribution structure layer RDL of the present embodiment may include at least one second opening ST2, wherein the second opening ST2 may overlap the side SS of the chip CP in the normal direction of the electronic device ED. Therefore, in the normal direction of the electronic device ED, the first opening ST1 may be overlapped with the second opening ST2 or at least partially overlapped with the second opening ST2. In the present embodiment, the second opening ST2 may be formed by removing a portion of the insulating layer IL2, but the present disclosure is not limited thereto. In other words, the second opening ST2 may serve as the through hole penetrating through the insulating layer IL2 to disconnect the insulating layer IL2. In some embodiments, the electronic device ED may include the first opening ST1 but not include the second opening ST2. In such condition, the conductive layer CL2 may extend on the flat insulating layer IL2. In some embodiments, the electronic device ED may include the second opening ST2 but not include the first opening ST1.

Specifically, as shown in FIG. 1 and FIG. 2, the electronic device ED may have a first region R1, a second region R2 and a third region R3. The first region R1 may be the region in the electronic device ED substantially corresponding to the sides SS of the chip CP. The second region R2 may be the region in the electronic device ED substantially corresponding to the chip CP. In the top view of the electronic device ED (for example, FIG. 2), the second region R2 may be enclosed by the first region R1, but not limited thereto. The third region may be the region in the electronic device ED other than the first region R1 and the second region R2. According to the present embodiment, the first opening ST1 of the element structure layer ES and/or the second opening ST2 of the redistribution structure layer RDL may be disposed in the first region R1 of the electronic device ED, such that the first opening ST1 and/or the second opening ST2 may be overlapped with the side SS of the chip CP. In the present embodiment, as shown in FIG. 2 the chip CP may for example include a rectangular shape and has four sides SS, the element structure layer ES (and/or the redistribution structure layer RDL) may include one first opening ST1 (and/or one second opening ST2), wherein the first opening ST1 and/or the second opening ST2 may be disposed along four sides SS of the chip CP (the ranges of the first opening ST1 and/or the second opening ST2 are shown in oblique lines in FIG. 2), that is, the first opening ST1 and/or the second opening ST2 may surround the chip CP (or surround the second region R2) in the top view of the electronic device ED, but the present disclosure is not limited thereto. In some embodiments, the first opening ST1 and/or the second opening ST2 may not completely surround the chip CP in the top view of the electronic device ED. In some embodiments, the element structure layer ES (and/or the redistribution structure layer RDL) may include a plurality of first openings ST1 (and/or a plurality of second openings ST2) respectively disposed along a portion of the side SS of the chip CP. The electronic device ED may further include other openings, and the present disclosure is not limited thereto.

In recent chip package structure, the layers corresponding to the sides of the chip may be easily broken or damaged due to the influence of stress, thereby reducing the reliability of the device. For example, when the chip is disposed, the stress on the layers corresponding to the sides of the chip may be greater. According to the first embodiment provided by the present disclosure, since the redistribution structure layer RDL and/or the element structure layer ES include the first opening ST1 and/or the second opening ST2 corresponding to the side(s) SS of the chip CP, the stress on the insulating layers of the redistribution structure layer RDL and the element structure layer ES corresponding to the side(s) SS of the chip CP may be reduced, such that the probability that the insulating layers of the redistribution structure layer RDL and the element structure layer ES are broken may be reduced. In addition, as shown in FIG. 1, the bottom of the first opening ST1 and the bottom of the second opening ST2 may be arc-shaped or include other suitable non-sharp shapes, but not limited thereto. Therefore, the stress on the portions of the redistribution structure layer RDL and the element structure layer ES corresponding to the sides SS of the chip CP may be reduced.

According to the present embodiment, the electronic device ED may further include a supporting element disposed in the opening. Specifically, the portions of the elements and/or the layers of the electronic device ED filled into the opening may be defined as the supporting element. For example, as shown in FIG. 1, the element structure layer ES may include the first opening ST1, and a portion of the insulating layer IL1 of the redistribution structure layer RDL may extend into the first opening ST1 or be filled into the first opening ST1. In such condition, the portion of the insulating layer IL1 filled into the first opening ST1 may be defined as the supporting element SP1. The material of the supporting element SP1 may be determined according to the materials of the layers and/or the elements filled into the first opening ST1. In the present embodiment, since the portion of the insulating layer IL1 may be filled into the first opening ST1, the material of the supporting element SP1 may be the material of the insulating layer IL'. In some other embodiments, a portion of the conductive layer (for example, the conductive layer CL2) of the redistribution structure layer RDL may be filled into the first opening ST1, and the material of the supporting element SP1 may be the material of the conductive layer CL2. In some other embodiments, portions of the insulating layer IL1 and the conductive layer CL2 of the redistribution structure layer RDL may be filled into the first opening ST1, and the material of the supporting element SP1 may include the material of the insulating layer IL1 and the material of the conductive layer CL2. In other words, the supporting element SP1 may include insulating materials, metal materials or combinations of the above-mentioned materials. As mentioned above, the first insulating layer IL1 may include organic insulating materials. Therefore, by disposing the supporting element SP1 in the first opening ST1, wherein the supporting element SP1 may include organic insulating materials or metal materials, the stress on the portion of the electronic device ED corresponding to the sides SS of the chip CP may be reduced, thereby improving the reliability of the electronic device ED. Similarly, as shown in FIG. 1, the redistribution structure layer RDL may include the second opening ST2, and portions of the conductive layer CL2 and the insulating layer IL3 of the redistribution structure layer RDL may extend into the second opening ST2. Therefore, the electronic device ED may include the supporting element SP2 disposed in the second opening ST2, wherein the supporting element SP2 may include portions of the conductive layer CL2 and the insulating layer IL3, but not limited thereto. According to the embodiments of the present disclosure, the supporting element SP2 may include one or more of the insulating materials and the conductive materials.

In some embodiments, the surface of the redistribution structure layer RDL of the electronic device ED may optionally have at least one recess, wherein the recess may be overlapped with the side SS of the chip CP in the normal direction of the electronic device ED. Specifically, as shown in FIG. 1, the surface S4 of the redistribution structure layer RDL facing the chip CP may have a recess RS, wherein the recess RS may correspond to the side SS of the chip CP. The recess RS may be formed by removing at least a portion of the surface of the redistribution structure layer RDL, for example, the recess RS may be formed by removing a portion of the insulating layer IL3, but not limited thereto. In some embodiments, the recess RS may extend along the sides SS of the chip CP any form an enclosed structure. In some embodiments, the recess RS may extend along a portion of the side SS of the chip CP. In some embodiments, the surface S4 of the redistribution structure layer RDL may have a plurality of recesses RS respectively extend along a portion of the side SS of the chip CP. In the normal direction of the electronic device ED, since the recess RS may be overlapped with the side SS of the chip CP, the recess RS may be overlapped or at least partially overlapped with the first opening ST1 and/or the second opening ST2, but not limited thereto. The bottom of the recess RS may be arc-shaped or include other suitable non-sharp shapes, but not limited thereto. By forming the recess RS on the surface S4 of the redistribution structure layer RDL, the stress on the portion of the electronic device ED corresponding to the sides SS of the chip CP may be reduced. In some embodiments, the surface S4 of the redistribution structure layer RDL may not include the recess RS. In detail, in the normal direction of the electronic device ED, the height of the recess RS is lower than the thickness of the insulating layer of the redistribution structure layer RDL. Specifically, the height of the recess RS is lower than half of the thickness of the insulating layer of the redistribution structure layer RDL.

In some embodiments, the electronic element EL in the element structure layer ES may not be overlapped with the side(s) SS of the chip CP in the normal direction of the electronic device ED. In other words, the electronic element EL may be disposed not corresponding to the side (s) SS of the chip CP. Specifically, the electronic element EL of the present embodiment may include a thin film transistor element, wherein the thin film transistor element may not be overlapped with the side (s) SS of the chip CP in the normal direction of the electronic device ED. "The thin film transistor element is not overlapped with the side(s) SS of the chip CP" mentioned above may at least include the condition that the semiconductor layer SM of the thin film transistor element is not overlapped with the side (s) SS of the chip CP, but not limited thereto. In such condition, the electronic element EL may not be disposed in the first region R1 of the electronic device ED. In some embodiments, as shown in FIG. 1, the electronic element EL may be disposed in the third region R3. In some embodiments, although it is not shown in the figure, the electronic element EL may be disposed in the second region R2, that is, the electronic element EL may be overlapped with a portion of the chip CP but not overlapped with the side(s) SS of the chip CP in the normal direction of the electronic device ED. By making the disposition position of the electronic element EL not corresponding to the side(s) SS of the chip CP, the influence of stress on the electronic element EL may be reduced. In addition, in some embodiments, the electronic element EL may not be overlapped with the bonding pad SD1 and/or the bonding pad SD2 in the normal direction of the electronic device ED. In other words, the disposition position of the electronic element EL may not correspond to the side(s) SS of the chip CP, the bonding pad SD1 and/or the bonding pad SD2. In such condition, the electronic element EL may be disposed at a position in the second region R2 or the third region R3 not corresponding to the bonding pads.

Other embodiments of the present disclosure will be described in the following. In order to simplify the description, the same elements or layers in the following embodiments would be labeled with the same symbol, and the features thereof will not be redundantly described. The differences between the embodiments will be detailed in the following.

Referring to FIG. 3, FIG. 3 schematically illustrates a cross-sectional view of an electronic device according to a second embodiment of the present disclosure. According to the present embodiment, the element structure layer ES may include the first opening ST1, and the conductive layer CL2 of the redistribution structure layer RDL may extend into the first opening ST1. In other words, the conductive layer CL2 may be filled into the first opening ST1. In detail, as shown in FIG. 3, the portions of the insulating layer IL1 and the insulating layer IL2 of the redistribution structure layer RDL and the insulating layer IL4, the insulating layer IL5 and the insulating layer IL6 of the element structure layer ES corresponding to the side(s) SS of the chip CP may be removed to form the first opening ST1 of the element structure layer ES and the second opening ST2 of the redistribution structure layer RDL, and the conductive layer CL2 disposed on the insulating layer IL2 may extend downward and be filled into the first opening ST1 and the second opening ST2. In such condition, the supporting element SP1 disposed in the first opening ST1 and the supporting element SP2 disposed in the second opening ST2 may include the material of the conductive layer CL2, such metal materials. In addition, the supporting element SP1 may for example contact the supporting element SP2. Furthermore, the first opening ST1 may be overlapped or at least partially overlapped with the second opening ST2 in the normal direction of the electronic device ED.

In addition, in the present embodiment, as shown in FIG. 3, the surface S4 of the redistribution structure layer RDL may include a plurality of recesses RS, wherein the recesses RS may be disposed in the first region R1 of the electronic device ED, or in other words, disposed corresponding to (or adjacent to) the side(s) SS of the chip CP. In some embodiments, the recesses RS may respectively extend along the sides SS of the chip CP and form the enclosed structures. In some embodiments, the recesses RS may respectively extend along a portion of the side SS of the chip CP. It should be noted that the number and shape of the recess RS shown in FIG. 3 are exemplary, and the present disclosure is not limited thereto.

In addition, compared with the structure shown in FIG. 1, the structure of the under bump metallization layer of the present embodiment may be different. In some embodiments, the under bump metallization layer may be aligned with the surface of the insulating layer in which the under bump metallization layer is disposed. For example, as shown in FIG. 3, the surface S2 of the under bump metallization layer UM1 in contact with the bonding pad SD1 may be aligned with the surface of the insulating layer IL3, and the surface S2 of the under bump metallization layer UM1 may substantially be a flat surface. In some embodiments, the under bump metallization layer may protrude from the surface of the insulating layer in which the under bump metallization layer is disposed, and the surface of the under bump metallization layer may be a flat surface. For example, as shown in FIG. 3, the surface S3 of the under bump metallization layer UM2 in contact with the bonding pad SD2 may protrude from the surface of the buffer layer INL, and the surface S3 of the under bump metallization layer UM2 may substantially be a flat surface. The structural features of the under bump metallization layer mentioned in the present embodiment and the above-mentioned embodiment may be applied to the embodiments of the preset disclosure.

The structural features of other elements and/or layers of the electronic device ED shown in FIG. 3 may refer to the contents mentioned above, and will not be redundantly described.

Figure 4:
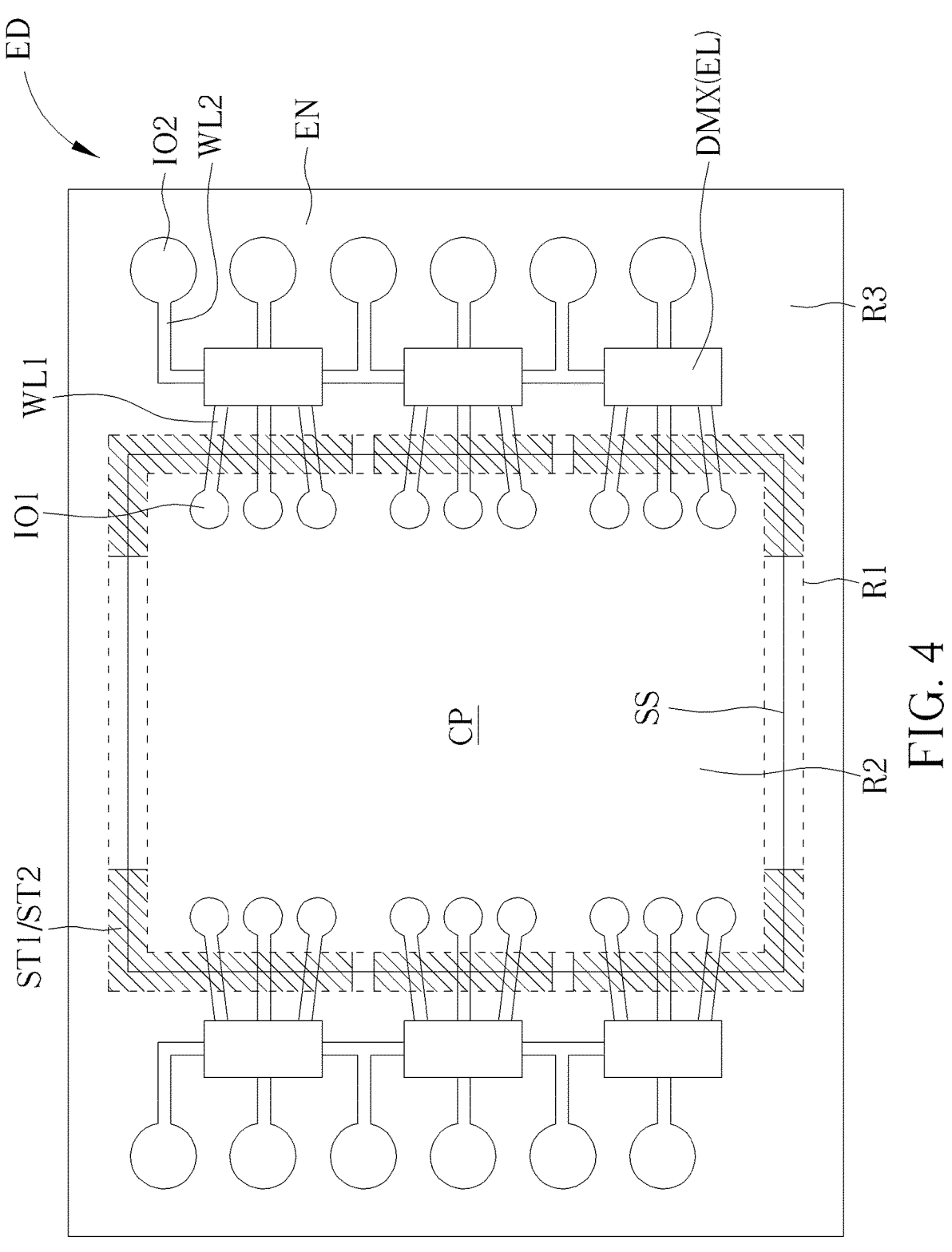
FIG. 4 schematically illustrates a top view of configuration of elements in an electronic device according to a third embodiment of the present disclosure.
Figure 5:
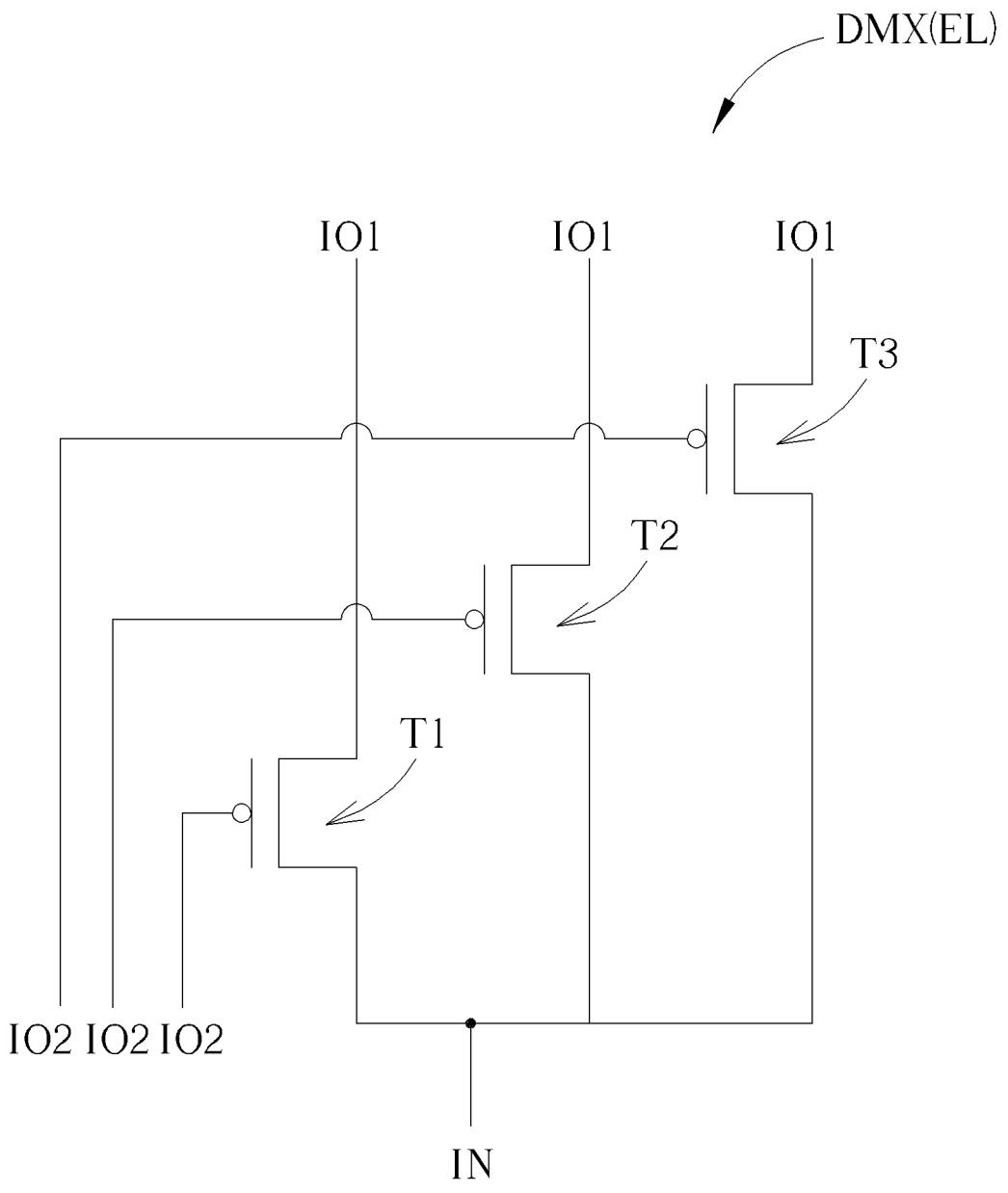
FIG. 5 shows an equivalent circuit diagram of an electronic element according to the third embodiment of the present disclosure.

Referring to FIG. 4 and FIG. 5, FIG. 4 schematically illustrates a top view of configuration of elements in an electronic device according to a third embodiment of the present disclosure, and FIG. 5 shows an equivalent circuit diagram of an electronic element according to the third embodiment of the present disclosure. According to the present embodiment, the first opening ST1 of the element structure layer ES and/or the second opening ST2 of the redistribution structure layer RDL may not completely surround the chip CP in the top view of the electronic device ED. In detail, as shown in FIG. 4, the element structure layer ES (and/or the redistribution structure layer RDL) of the present embodiment may include a plurality of first openings ST1 (and/or a plurality of second openings ST2), and these first openings ST1 (and/or second openings ST2) may respectively be disposed along a portion of the side SS of the chip CP. In the present embodiment, the first openings ST1 and/or the second openings ST2 may be disposed corresponding to the wires WL1 for electrically connecting the I/O points of the chip CP and the electronic element EL, that is, the first openings ST1 and/or the second openings ST2 may be overlapped with the wires WL1 in the normal direction of the electronic device ED, but not limited thereto. In other words, the first openings ST1 and/or the second openings ST2 may be disposed in a portion of the first region R1 corresponding to the wires WL1. As mentioned above, the wires WL1 may include the conductive layer CL2 of the redistribution structure layer RDL. Therefore, the first openings ST1 and/or the second openings ST2 may be overlapped with the conductive layer CL2 of the redistribution structure layer RDL, but not limited thereto.

In addition, in the present embodiment, the electronic element EL may for example include a demultiplexer DMX, wherein the demultiplexer DMX may include at least one thin film transistor element, but not limited thereto. For example, as shown in FIG. 5, the demultiplexer DMX may include a thin film transistor T1, a thin film transistor T2 and a thin film transistor T3, wherein the gates of these thin film transistors may respectively be electrically connected to one of the I/O points IO2, the source electrodes of these thin film transistors may be electrically connected to a signal input terminal IN, and the drain electrodes of these thin film transistors may respectively be electrically connected to a signal output terminal, wherein the signal output terminals may be electrically connected to the I/O points IO1. It should be noted that the circuit of the demultiplexer DMX shown in FIG. 5 is exemplary, and the present disclosure is not limited thereto. By making the electronic element EL of the electronic device ED including the demultiplexer DMX, the number of the I/O points IO2 may be reduced, such that the layout of the wires in the electronic device ED may be simplified. In the present embodiment, the demultiplexer DMX may not be overlapped with the side (s) SS of the chip CP in the normal direction of the electronic device ED, or the demultiplexer DMX may be disposed not corresponding to the side(s) SS of the chip CP. In addition, the demultiplexer DMX may not be overlapped with the bonding pad SD1 and/or the bonding pad SD2 in the normal direction of the electronic device ED in some embodiments. In such condition, the demultiplexer DMX may be disposed at a position in the second region R2 or the third region R3 not corresponding to the bonding pads.

Figure 6:
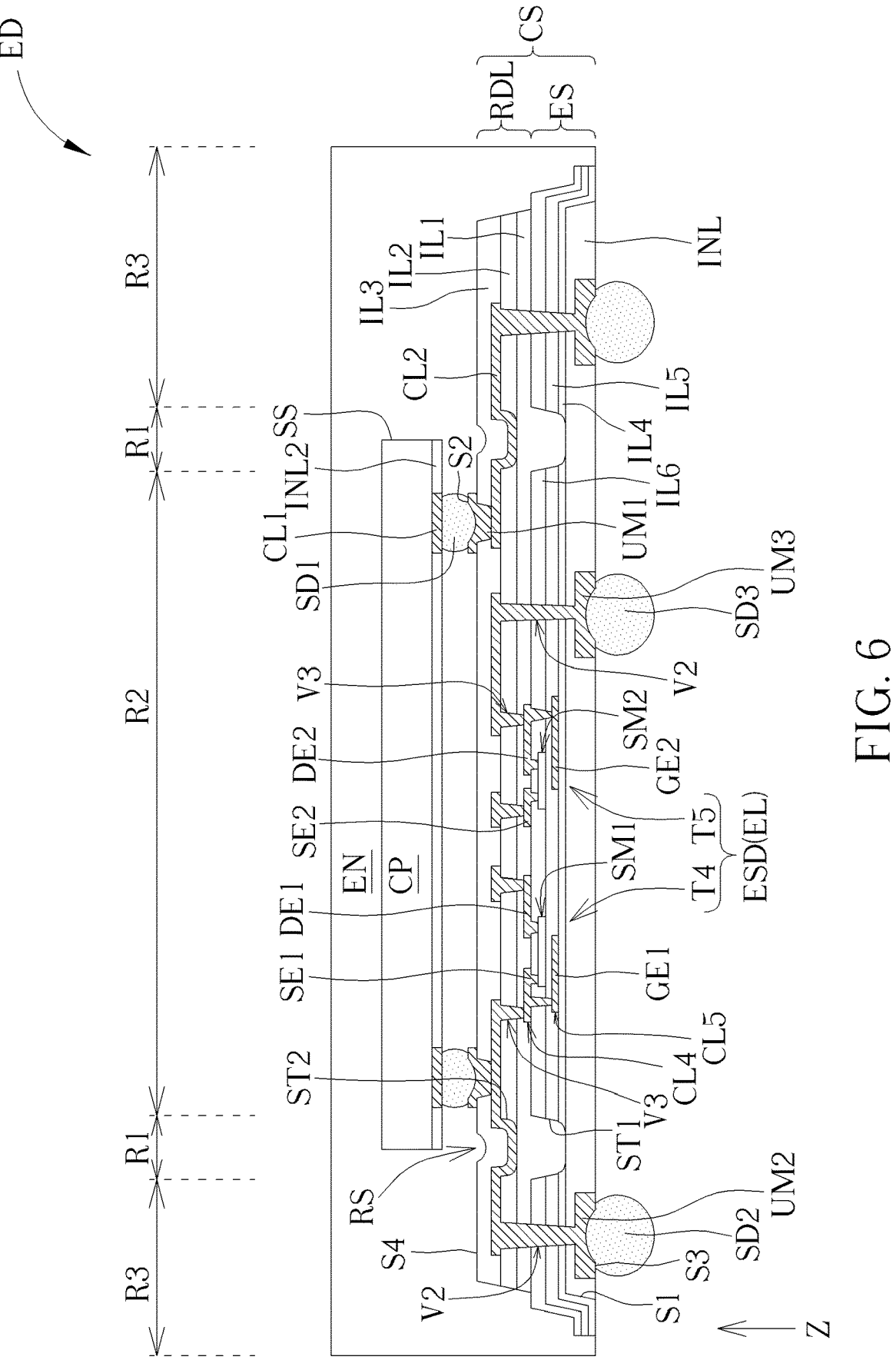
FIG. 6 schematically illustrates a cross-sectional view of an electronic device according to a fourth embodiment of the present disclosure.
Figure 7:
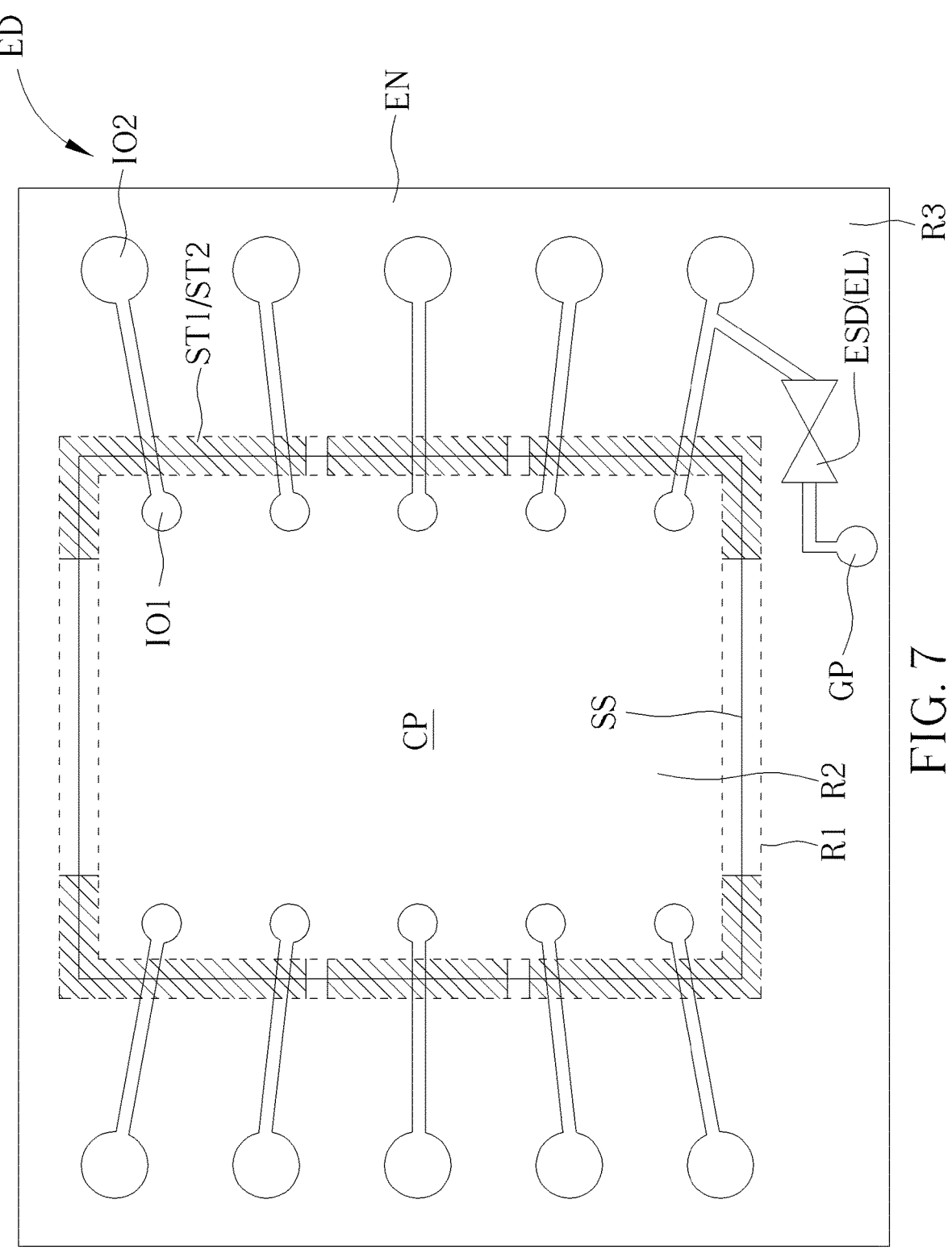
FIG. 7 schematically illustrates a top view of configuration of elements in the electronic device according to the fourth embodiment of the present disclosure.

Referring to FIG. 6 and FIG. 7, FIG. 6 schematically illustrates a cross-sectional view of an electronic device according to a fourth embodiment of the present disclosure, and FIG. 7 schematically illustrates a top view of configuration of elements in the electronic device according to the fourth embodiment of the present disclosure. According to the present embodiment, the electronic element EL of the element structure layer ES of the electronic device ED may include an electrostatic discharge protecting element ESD. The electrostatic discharge protecting element ESD may be electrically connected between the I/O point IO1 and the I/O point IO2 for discharging static electricity.

Specifically, as shown in FIG. 7, the electrostatic discharge protecting element ESD may be electrically connected to the electrical connection path between the I/O point IO1 and the I/O point IO2 and be electrically connected to a grounded point GP. FIG. 6 exemplarily shows the structure of the electrostatic discharge protecting element ESD of the present embodiment. The structure and the electrical connecting way of the electrostatic discharge protecting element ESD will be detailed in the following. It should be noted that the electrostatic discharge protecting element ESD of the present embodiment may include any suitable structure or be electrically connected to the I/O points IO1 and the I/O points IO2 in any suitable way, which is not limited to the structure shown in FIG. 6.

As shown in FIG. 6, the electrostatic discharge protecting element ESD may include a thin film transistor T4 and a thin film transistor T5, wherein the thin film transistor T4 includes a gate electrode GE1, a semiconductor layer SM1, a drain electrode DE1 and a source electrode SE1, and the thin film transistor T5 includes a gate electrode GE2, a semiconductor layer SM2, a drain electrode DE2 and a source electrode SE2. The source electrode SE1 of the thin film transistor T4 may be electrically connected to the semiconductor layer SM1 and the gate electrode GE1, and the drain electrode DE2 of the thin film transistor T5 may be electrically connected to the semiconductor layer SM2 and the gate electrode GE2. The element structure layer ES may include an insulating layer IL4, a conductive layer CL5 disposed on the insulating layer IL4, an insulating layer IL5 disposed on the insulating layer IL4 and covering the conductive layer CL5, a semiconductor layer SM1 and a semiconductor layer SM2 disposed on the insulating layer IL5, and an insulating layer IL6 disposed on the insulating layer IL5 and covering the semiconductor layer SM1 and the semiconductor layer SM2, wherein the conductive layer CL5 may form the gate electrode GE1 and the gate electrode GE2, and the conductive layer CL4 may form the drain electrode DE1, the source electrode SE1, the drain electrode DE2 and the source electrode SE2, but not limited thereto. The thin film transistor T4 and the thin film transistor T5 of the present embodiment may be bottom gate thin film transistors, but not limited thereto. As shown in FIG. 6, the source electrode SE1 of the thin film transistor T4 may be electrically connected between the bonding pad SD1 and the bonding pad SD2 through the conductive layer CL2, and the drain electrode DE2 of the thin film transistor T5 may be electrically connected to a under bump metallization layer UM3 and a bonding pad SD3 through the conductive layer CL2. Specifically, a portion of the conductive layer CL2 may be filled into a via V3 penetrating the insulating layer IL1 and the insulating layer IL2 and contact the source electrode SE1, such that the thin film transistor T4 may be electrically connected between the bonding pad SD1 and the bonding pad SD2. In addition, another portion of the conductive layer CL2 may be filled into a via V3 and contact the drain electrode DE2, and the another portion of the conductive layer CL2 may also be filled into the via V2 and contact the under bump metallization layer UM3. The bonding pad SD3 may be grounded, that is, the bonding pad SD3 may be electrically connected to the grounded point GP shown in FIG. 7. Therefore, the electrostatic discharge protecting element ESD may be grounded through the conductive layer CL2, the under bump metallization layer UM3 and the bonding pad SD3. Moreover, although it is not shown in FIG. 6, the source electrode SE1 of the thin film transistor T4 may be electrically connected to the source electrode SE2 of the thin film transistor T5, and the drain electrode DE1 of the thin film transistor T4 may be electrically connected to the drain electrode DE2 of the thin film transistor T5. The material of the under bump metallization layer UM3 may refer to the materials of the under bump metallization layer UM1 and the under bump metallization layer UM2 mentioned above. The material of the bonding pad SD3 may refer to the materials of the bonding pad SD1 and the bonding pad SD2 mentioned above. Through the structural design mentioned above, the static electricity on the electrical connecting path between the I/O point IO1 and the I/O point IO2 may be discharged by the electrostatic discharge protecting element ESD, such that the influence of static electricity on the electronic device ED may be reduced.

According to the present embodiment, in the normal direction of the electronic device ED, the electrostatic discharge protecting element ESD may not be overlapped with the side(s) SS of the chip CP, or the electrostatic discharge protecting element ESD may be disposed not corresponding to the side(s) SS of the chip CP. In addition, the electrostatic discharge protecting element ESD may not be overlapped with the bonding pad SD1, the bonding pad SD2 and the bonding pad SD3 in some embodiments. Therefore, in some embodiments, as shown in FIG. 6, the electrostatic discharge protecting element ESD may be disposed at a position in the second region R2 not corresponding to the bonding pad SD2 and the bonding pad SD3. In some embodiments, as shown in FIG. 7, the electrostatic discharge protecting element ESD may be disposed at a position in the third region R3 not corresponding to the bonding pad SD1.

Although it is not shown in FIG. 6 and FIG. 7, the element structure layer ES of the electronic device ED may further include other electronic elements EL (such as the driving element DU shown in FIG. 1) electrically connected between the I/O points IO1 and the I/O points IO2 or electrically connected between the bonding pads SD1 and the bonding pads SD2. In addition, the disposing ways of the first opening ST1 and/or the second opening ST2 shown in FIG. 7 are exemplary, and the present embodiment is not limited thereto. Structural features of other elements and/or layers of the electronic device ED shown in FIG. 6 may refer to the contents mentioned above, and will not be redundantly described.

Figure 8:
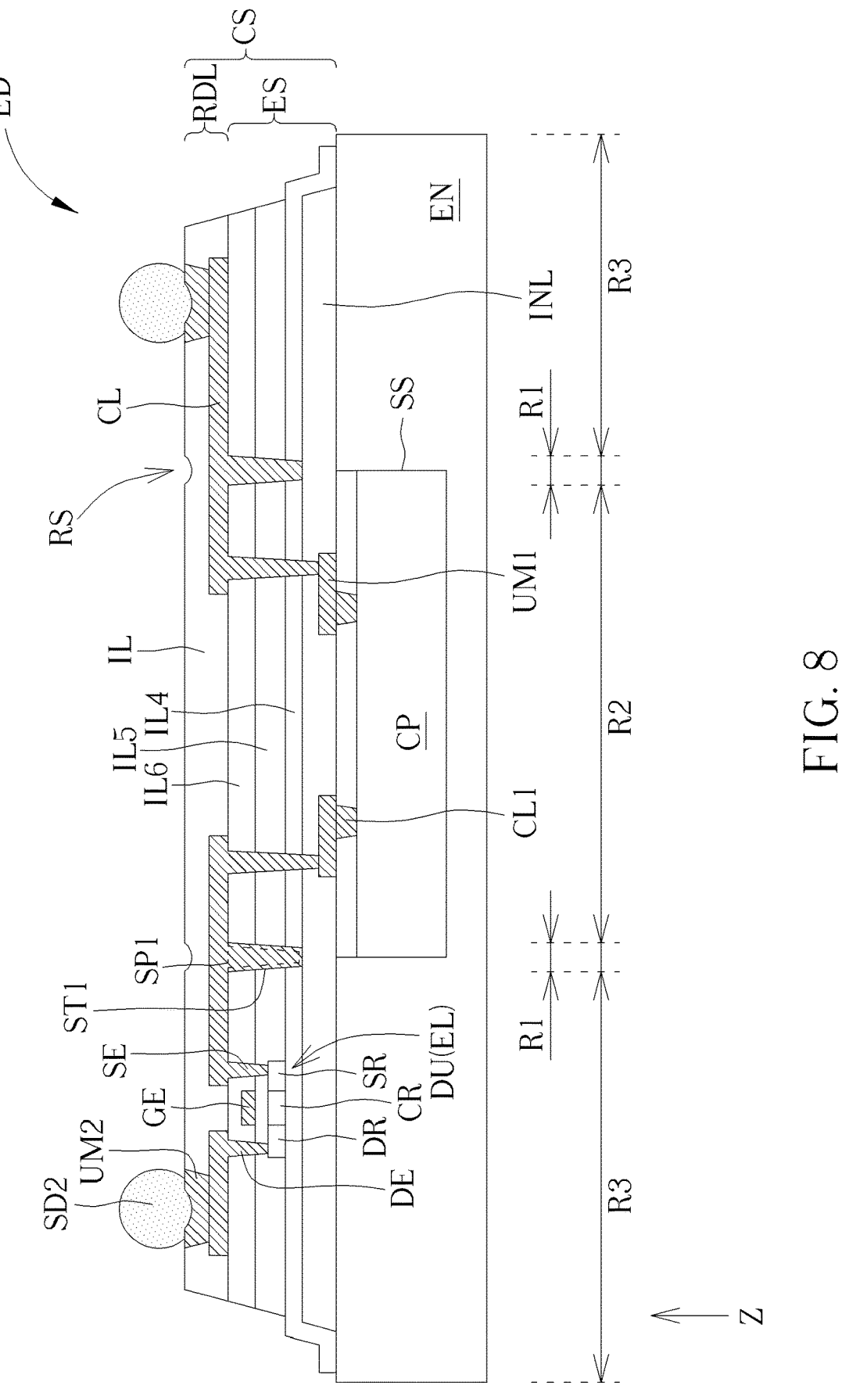
FIG. 8 schematically illustrates a cross-sectional view of an electronic device according to a fifth embodiment of the present disclosure.

Referring to FIG. 8, FIG. 8 schematically illustrates a cross-sectional view of an electronic device according to a fifth embodiment of the present disclosure. According to the present embodiment, the forming method of the electronic device ED may include forming an encapsulated structure including the chip CP and the encapsulation layer EN surrounding the chip CP at first, and then forming the circuit structure layer CS on the encapsulated structure. For example, the element structure layer ES may be formed on the above-mentioned encapsulated structure at first, and then the redistribution structure layer RDL may be disposed on the element structure layer ES, but not limited thereto. In other words, the element structure layer ES may be disposed between the chip CP and the redistribution structure layer RDL. In addition, the electronic device ED may further include the buffer layer INL disposed between the encapsulation layer EN and the circuit structure layer CS. It should be noted that the buffer layer INL may include a structure formed by stacking conductive layers and insulating layers and may serve as another redistribution structure layer. The external electronic element may be electrically connected to the conductive layer(s) of the redistribution structure layer RDL through the bonding pad SD2 and the under bump metallization layer UM2, and thereby be electrically connected to the electronic element EL in the element structure layer ES through the conductive layer(s) of the redistribution structure layer RDL. For example, the external electronic element may be electrically connected to the drain electrode DE or the source electrode SE (for example, the drain electrode DE, but not limited thereto) of the electronic element EL (or the driving element DU). In order to simplify the figure, the conductive layer(s) of the redistribution structure layer RDL is presented as a single conductive layer CL in FIG. 8, and the insulating layer(s) of the redistribution structure layer RDL is presented as a single insulating layer IL in FIG. 8, but the present embodiment is not limited thereto. The drain electrode DE or the source electrode SE (for example, the source electrode SE, but not limited thereto) of the electronic element EL (or the driving element DU) may be electrically connected to the under bump metallization layer UM1 and the conductive layer CL1 through the conductive layer CL of the redistribution structure layer RDL, such that the chip CP may be electrically connected to the external electronic element.

In the present embodiment, the element structure layer ES may include at least one first opening ST1, wherein the first opening ST1 may be overlapped with the side (s) SS of the chip CP in the normal direction of the electronic device ED. That is, the first opening ST1 may be disposed corresponding to the first region R1. In the normal direction of the electronic device ED, the first opening ST1 may extend along the sides SS and surround the chip CP, but not limited thereto. In some embodiments, the first opening ST1 may extend along at least a portion of the side SS. In addition, in the present embodiment, the conductive layer CL of the redistribution structure layer RDL may be filled into the first opening ST1, that is, the supporting element SP1 disposed in the first opening ST1 may include the material of the conductive layer CL, such as metal materials, but not limited thereto. Structural features of the layers or the elements of the element structure layer ES may refer to the contents in the above-mentioned embodiments, and will not be redundantly described. In addition, the surface of the redistribution structure layer RDL of the present embodiment may include the recess RS, wherein the recess RS may be at least partially overlapped with the side SS of the chip CP in the normal direction of the electronic device ED, but not limited thereto.

Figure 9:
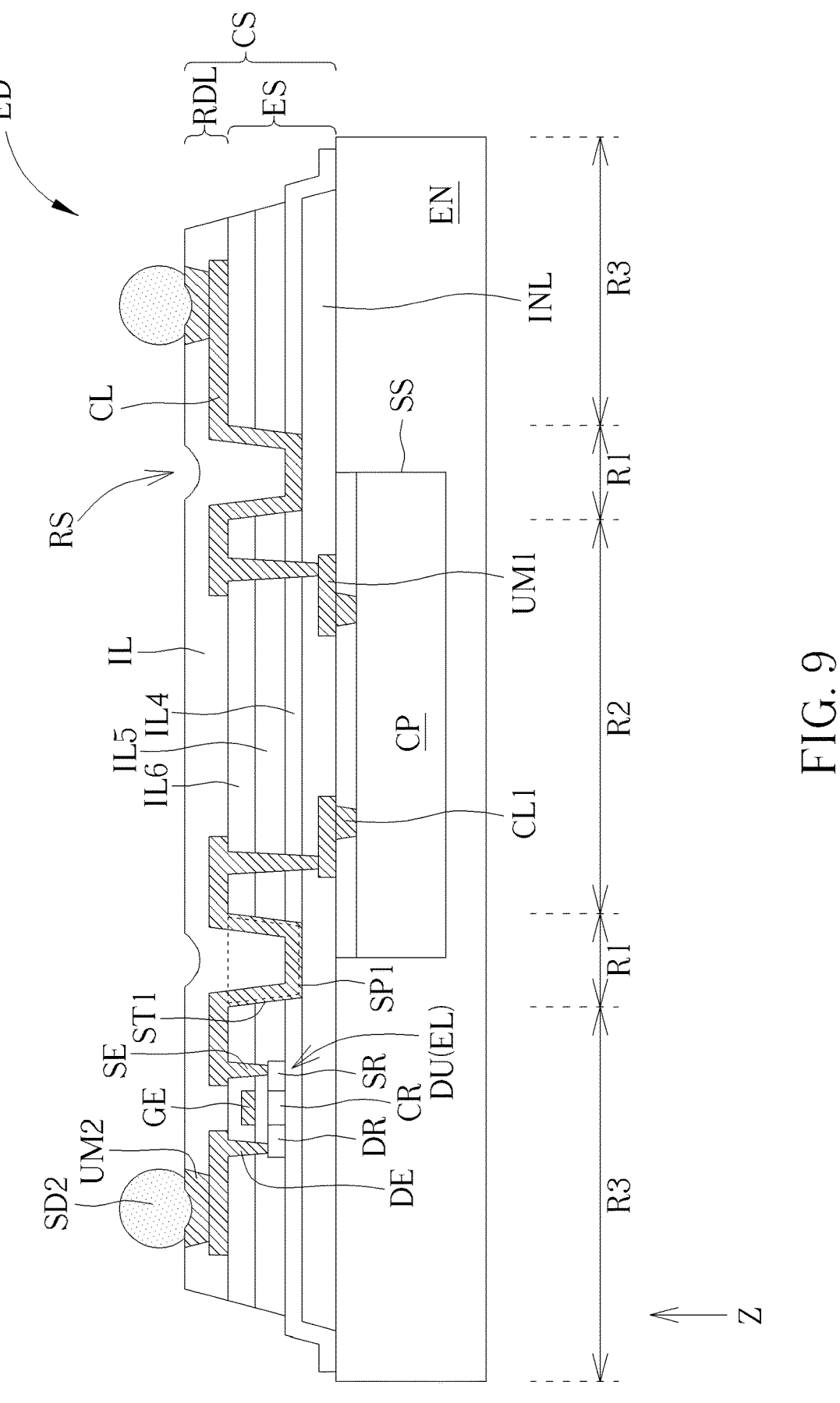
FIG. 9 schematically illustrates a cross-sectional view of an electronic device according to a sixth embodiment of the present disclosure.

Referring to FIG. 9, FIG. 9 schematically illustrates a cross-sectional view of an electronic device according to a sixth embodiment of the present disclosure. One of the main differences between the electronic device ED shown in FIG. 9 and the electronic device ED shown in FIG. 8 is the structure of the supporting element SP1. Specifically, as shown in FIG. 9, in the electronic device ED, portions of the insulating layer(s) (shown as the insulating layer IL) and the conductive layer(s) (shown as the conductive layer CL) of the redistribution structure layer RDL may be filled into the first opening ST1. In such condition, the supporting element SP1 disposed in the first opening ST1 may include the combination of conductive materials and insulating materials. For example, the supporting element SP1 may include combinations of metal materials and organic insulating materials, but not limited thereto. Structural features of other elements or layers of the electronic device ED of the present embodiment may refer to the contents mentioned above, and will not be redundantly described.

In summary, an electronic device is provided by the present disclosure. The electronic device includes a chip and a circuit structure layer overlapped with the chip, wherein the circuit structure layer includes a redistribution structure layer and an element structure layer. At least one of the redistribution structure layer and the element structure layer includes at least one opening, wherein the opening may be overlapped with at least a portion of at least one side of the chip in the normal direction of the electronic device. Therefore, the probability that the elements or the layers of the electronic device are damaged due to being affect by the stress may be reduced, thereby improving the reliability of the electronic device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
a chip; and
a circuit structure layer overlapped with the chip, wherein the circuit structure layer comprises a redistribution structure layer and an element structure layer, and the redistribution structure layer and the element structure layer are electrically connected to the chip,
wherein at least one of the redistribution structure layer and the element structure layer comprises at least one opening, and in a direction perpendicular to a top surface of the chip, the at least one opening is overlapped with a side of the chip;
wherein the at least one opening comprises a first opening of the element structure layer, the redistribution structure layer comprises at least one insulating layer and at least one conductive layer, and a portion of the at least one conductive layer extends into the first opening.

2. The electronic device of claim 1, further comprising an encapsulation layer surrounding the chip.

3. The electronic device of claim 1, wherein the at least one opening further comprises a second opening of the redistribution structure layer, and in the direction perpendicular to the top surface of the chip, the first opening is overlapped with the second opening.

4. The electronic device of claim 1, further comprising a buffer layer, wherein the element structure layer is disposed between the buffer layer and the redistribution structure layer.

5. The electronic device of claim 1, wherein a surface of the redistribution structure layer has at least one recess, and in the direction perpendicular to the top surface of the chip, the at least one recess is overlapped with the side of the chip.

6. The electronic device of claim 5, wherein a bottom of the at least one recess is arc-shaped.

7. The electronic device of claim 5, wherein a height of the at least one recess is lower than half of a thickness of the at least one insulating layer.

8. The electronic device of claim 1, further comprising a supporting element disposed in the at least one opening, wherein the supporting element comprises insulating material, metal material or combination thereof.

9. The electronic device of claim 1, wherein the element structure layer comprises a thin film transistor element.

10. The electronic device of claim 9, wherein in the direction perpendicular to the top surface of the chip, the thin film transistor element is not overlapped with the side of the chip.

11. The electronic device of claim 1, further comprising a bonding pad disposed between the chip and the redistribution structure layer, wherein the redistribution structure layer is electrically connected to the chip through the bonding pad.

12. The electronic device of claim 11, wherein the element structure layer comprises at least one electronic element, and in the direction perpendicular to the top surface of the chip, the at least one electronic element is not overlapped with the bonding pad.

13. The electronic device of claim 1, wherein the element structure layer comprises at least one electronic element, and the at least one electronic element comprises a demultiplexer.

14. The electronic device of claim 1, wherein the element structure layer comprises at least one electronic element, and the at least one electronic element comprises an electrostatic discharge protecting element.

15. The electronic device of claim 1, wherein the redistribution structure layer is disposed between the chip and the element structure layer.

16. The electronic device of claim 1, wherein the element structure layer is disposed between the chip and the redistribution structure layer.

17. The electronic device of claim 1, wherein a bottom of the at least one opening is arc-shaped.

* * * * *